United States Patent
Jiang

(10) Patent No.: US 9,080,729 B2
(45) Date of Patent: Jul. 14, 2015

(54) MULTIPLE-LED EMITTER FOR A-19 LAMPS

(75) Inventor: Wu Jiang, Sunnyvale, CA (US)

(73) Assignee: LedEngin, Inc., San Jose, CA (US)

( * ) Notice: Subject to any disclaimer, the term of this patent is extended or adjusted under 35 U.S.C. 154(b) by 252 days.

(21) Appl. No.: 13/272,768

(22) Filed: Oct. 13, 2011

(65) Prior Publication Data

US 2013/0093354 A1   Apr. 18, 2013

(51) Int. Cl.

| F21V 5/00 | (2015.01) |
|---|---|
| F21K 99/00 | (2010.01) |
| F21V 5/04 | (2006.01) |
| F21V 3/00 | (2015.01) |
| F21V 13/02 | (2006.01) |
| F21Y 101/02 | (2006.01) |
| H01L 25/075 | (2006.01) |
| F21Y 113/00 | (2006.01) |

(52) U.S. Cl.
CPC . F21K 9/135 (2013.01); *F21K 9/50* (2013.01); *F21V 3/00* (2013.01); *F21V 5/04* (2013.01); *F21V 13/02* (2013.01); *F21Y 2101/02* (2013.01); *F21Y 2113/005* (2013.01); *H01L 25/0753* (2013.01); *H01L 2924/0002* (2013.01)

(58) Field of Classification Search
CPC ..................................... F21K 9/00; F21K 9/13
See application file for complete search history.

(56) References Cited

U.S. PATENT DOCUMENTS

| 4,337,759 A | 7/1982 | Popovich |
|---|---|---|
| 4,698,730 A | 10/1987 | Sakai et al. |
| 5,959,316 A | 9/1999 | Lowery |
| 6,307,160 B1 | 10/2001 | Mei et al. |
| 6,351,069 B1 | 2/2002 | Lowery et al. |
| 6,608,332 B2 | 8/2003 | Shimizu et al. |
| 6,614,179 B1 | 9/2003 | Shimizu et al. |
| 6,642,652 B2 | 11/2003 | Collins, III et al. |
| 6,680,128 B2 | 1/2004 | Mei |
| 6,791,116 B2 | 9/2004 | Takahashi et al. |

(Continued)

FOREIGN PATENT DOCUMENTS

| JP | 2000-349346 A | 12/2000 |
|---|---|---|
| JP | 2000-349347 A | 12/2000 |

(Continued)

OTHER PUBLICATIONS

Non-Final Office Action for U.S. Appl. No. 12/756,861, mailed Jan. 18, 2012, 17 pages.

(Continued)

*Primary Examiner* — Andrew Coughlin
(74) *Attorney, Agent, or Firm* — Kilpatrick Townsend and Stockton LLP

(57) ABSTRACT

An LED (light-emitting diode) high-power wide-angle A-19 lamp needs only a single LED emitter having multiple LEDs. The LED A-19 lamp includes a lamp envelop structure configured for transmission of light therethrough and a base structure coupled to a lower portion of the lamp envelop structure for coupling to an external power source. The dimensions of the lamp envelop structure and the base structure conform to requirement of a conventional A-19 lamp. The LED emitter includes a plurality of light-emitting diodes (LEDs) disposed in a single recess in a substrate and a single lens disposed over the LEDs and the substrate. In a specific embodiment, the emitter is configured to consume electrical power of 30 Watts or higher and to provide light distribution at 130 degrees or wider at 50% peak intensity without additional secondary optical components.

19 Claims, 12 Drawing Sheets

(56) References Cited

U.S. PATENT DOCUMENTS

| | | |
|---|---|---|
| 6,828,170 B2 | 12/2004 | Roberts et al. |
| 7,064,353 B2 | 6/2006 | Bhat |
| 7,139,125 B1 | 11/2006 | Mi |
| 7,156,538 B2 | 1/2007 | Han et al. |
| 7,157,744 B2 | 1/2007 | Palmteer et al. |
| 7,168,608 B2 | 1/2007 | Mei |
| 7,199,446 B1 | 4/2007 | Mei et al. |
| 7,264,378 B2 | 9/2007 | Loh |
| 8,384,097 B2 | 2/2013 | Yan |
| 2001/0015778 A1 | 8/2001 | Murade et al. |
| 2002/0015013 A1 | 2/2002 | Ragle |
| 2002/0163006 A1 | 11/2002 | Yoganandan et al. |
| 2002/0191885 A1 | 12/2002 | Wu et al. |
| 2003/0016899 A1 | 1/2003 | Yan |
| 2003/0086674 A1 | 5/2003 | Yan et al. |
| 2003/0095399 A1 | 5/2003 | Grenda et al. |
| 2003/0116769 A1* | 6/2003 | Song et al. ............ 257/79 |
| 2003/0122482 A1 | 7/2003 | Yamanaka et al. |
| 2003/0227249 A1 | 12/2003 | Mueller et al. |
| 2003/0230977 A1 | 12/2003 | Epstein |
| 2004/0004437 A1 | 1/2004 | Shimizu et al. |
| 2004/0051111 A1 | 3/2004 | Ota et al. |
| 2004/0079957 A1 | 4/2004 | Andrews et al. |
| 2004/0087165 A1 | 5/2004 | Theiss et al. |
| 2004/0102061 A1 | 5/2004 | Watanabe |
| 2004/0114393 A1 | 6/2004 | Galli |
| 2004/0126918 A1 | 7/2004 | Kurahashi et al. |
| 2004/0150991 A1 | 8/2004 | Ouderkirk et al. |
| 2004/0173810 A1 | 9/2004 | Lin et al. |
| 2004/0201025 A1 | 10/2004 | Barnett et al. |
| 2004/0257496 A1 | 12/2004 | Sonoda et al. |
| 2005/0035364 A1 | 2/2005 | Sano et al. |
| 2005/0093146 A1 | 5/2005 | Sakano |
| 2005/0127281 A1 | 6/2005 | Zheng et al. |
| 2005/0145872 A1 | 7/2005 | Fang et al. |
| 2005/0162864 A1* | 7/2005 | Verdes et al. .......... 362/555 |
| 2005/0179376 A1 | 8/2005 | Fung et al. |
| 2005/0199900 A1 | 9/2005 | Lin et al. |
| 2005/0224830 A1 | 10/2005 | Blonder et al. |
| 2005/0253242 A1 | 11/2005 | Costello et al. |
| 2005/0286131 A1 | 12/2005 | Saxena et al. |
| 2006/0012299 A1 | 1/2006 | Suehiro et al. |
| 2006/0063287 A1 | 3/2006 | Andrews |
| 2006/0082296 A1 | 4/2006 | Chua et al. |
| 2006/0082679 A1 | 4/2006 | Chua et al. |
| 2006/0091416 A1 | 5/2006 | Yan |
| 2006/0097385 A1 | 5/2006 | Negley |
| 2006/0170332 A1 | 8/2006 | Tamaki et al. |
| 2006/0227558 A1* | 10/2006 | Osawa et al. .......... 362/351 |
| 2006/0284209 A1 | 12/2006 | Kim et al. |
| 2007/0023769 A1 | 2/2007 | Nishimoto et al. |
| 2007/0081360 A1 | 4/2007 | Bailey et al. |
| 2007/0085103 A1* | 4/2007 | Nishioka et al. ........ 257/99 |
| 2007/0139437 A1 | 6/2007 | Boroson et al. |
| 2007/0194341 A1 | 8/2007 | Chang et al. |
| 2007/0241357 A1 | 10/2007 | Yan |
| 2008/0308825 A1 | 12/2008 | Chakraborty et al. |
| 2011/0095686 A1* | 4/2011 | Falicoff et al. ......... 315/35 |
| 2012/0224363 A1* | 9/2012 | Van De Ven .......... 362/231 |
| 2012/0286669 A1 | 11/2012 | Yan et al. |

FOREIGN PATENT DOCUMENTS

| | | |
|---|---|---|
| JP | 2001-057445 A | 2/2001 |
| JP | 2002-185046 A | 6/2002 |
| JP | 2004-241704 A | 8/2004 |
| JP | 2004-253404 A | 9/2004 |
| WO | WO2009130944 A1 | 10/2009 |

OTHER PUBLICATIONS

Notice of Allowance for U.S. Appl. No. 12/756,861 mailed of Oct. 19, 2012, 7 pages.

Kading, thermal conduction in metallized silicon-dioxide layers on silicon, Appl. Phys. Lett 65, 1994, pp. 1629-1631.

Official Action for Japanese patent application No. 2005-315149, Japan Patent Office, Jul. 21, 2009, pp. 1-3, 1-2.

"Solvent Soluble Polyimide with High Transparency and High Tg: HOP-400, 500", Hitachi Cable Review, Aug. 2003, No. 22, p. 78.

Yan, Xiantao et al., Two Test Specimens for Determining the Interfacial Fracture Toughness in Flip-Chip Assemblies, Transactions of the ASME, vol. 120, Jun. 1998, p. 150.

Yan, Xiantao, Analysis Based Design Guidelines for Metal Runner and Passivation Layers in IC Packaging, Delphi Automotive Systems Analytical Engineering Conference, May 2000, p. 1.

Office Action from China Intellectual Property Office for application 201010611921.3 (Jan. 13, 2014).

Notice of Allowance for U.S. Appl. No. 13/774,414 (Dec. 23, 2013) 10 pages.

Non-Final Office Action for U.S. Appl. No. 13/463,735 (Mar. 12, 2014) 5 pages.

\* cited by examiner

| Testing results | Emitter 530 40 W WW | Emitter 520 40 W WW |
|---|---|---|
| Relative Lumen output | 1 | 0.93 |
| View angle, 50% View angle, 80% | 110 135 | 130 180 |
| Emitter Dimensions | 12mm by 12 mm | 12mm by 12mm |

FIG. 6

MULTIPLE-LED EMITTER FOR A-19 LAMPS

CROSS-REFERENCES TO RELATED APPLICATIONS

This application is related to U.S. patent application Ser. No. 12/756,861, filed Apr. 8, 2010, entitled "Package for Multiple Light Emitting Diodes," which has been published as U.S. Patent App. Pub. No. 2010/0259930, and U.S. patent application Ser. No. 13/106,808, filed May 12, 2011, entitled "Tuning Of Emitter With Multiple LEDS To A Single Color Bin". The disclosures of both are incorporated by reference in their entirety herein.

BACKGROUND OF THE INVENTION

The present invention relates in general to lighting devices based on light-emitting diodes (LEDs) and in particular to LED emitters for lamps that can replace conventional A-19 incandescent lamps.

Among traditional incandescent light bulbs, the A-19 lamp, having a mushroom-shaped glass bulb, is the most popular. The widest part of the light bulb generally has a diameter of $19/8$ inches or $2\frac{3}{8}$ of an inch. The bulbs often have a metal screw base for inserting into an electric socket. A popular size for the base is 26 mm for the E26 base. The incandescent light bulbs suffer from low energy efficiency and short lifetime as they produce more heat than light. As a result, alternative lighting sources have been develop to replace the incandescent light bulbs.

LEDs are a promising technology more energy efficient and longer-lasting than incandescent light bulbs and are already widely deployed for specific purposes, such as traffic signals and flashlights. However, the development of LED-based lamps for general illumination has run into various difficulties. Among these is the difficulty of mass-producing lamps that provide high power light at a wide-angle.

For example, conventional LED-based lamps for replacing the A-19 incandescent bulbs are limited in their brightness, often produce light at 40 W incandescent equivalent with a power consumption of, e.g., 7-9 Watts. In part due to the size limitation of the A-19 bulbs, it is difficult to provide high power wide-angle LED emitters that are suitable for A-19 bulb applications.

Therefore, there is a need for a multiple-LED emitter module that can provide high power and wide-angle light suitable for A-19 lamp or similar applications.

BRIEF SUMMARY OF THE INVENTION

Embodiments of the present invention relate to high power LED emitter modules that include multiple LEDs that can provide wide-angle output light. In an embodiment, the emitter has a plurality of LED dice disposed in a recess of a substrate and a single lens that is configured for providing wide-angle light output. Particular embodiments are adapted for wide-angle applications of an A-19 lamp using the multiple-LED emitter without a secondary lens. The emitter can also be adapted by lamp manufacturers in many different applications.

According to an embodiment of the invention, a high-power wide-angle A-19 lamp needs only a single emitter having multiple LEDs and a single lens. The LED A-19 lamp can replace conventional incandescent A-19 lamp at lower power consumption and higher energy efficiency. The LED A-19 lamp includes a lamp envelop structure configured for transmission of light therethrough and a base structure coupled to a lower portion of the lamp envelop structure for coupling to an external power source. The dimensions of the lamp envelop structure and the base structure conform to requirement of a conventional A-19 lamp. For example, the widest part of the A-19 lamp envelop structure is usually $19/8$ of an inch, or $2\frac{3}{8}$ inches, and the diameter of the base structure usually fits into an electric socket with a diameter of, e.g., 26 mm. But the LED A-19 lamp can have dimensions that can differ from the standard dimension, but still can replace conventional A-19 lamp in various applications.

The LED A-19 lamp described above also has a driver circuit coupled to the base for receiving power from the external power source and an LED emitter disposed inside the lamp envelop structure for receiving regulated power from the driver circuit and for emitting light that is transmitted through the lamp envelop structure. The LED emitter includes a plurality of light-emitting diodes (LEDs) disposed in a single recess in a substrate and a single lens disposed over the LEDs and the substrate. In a specific embodiment, the emitter is configured to consume electrical power of 30 Watts or higher and to provide light distribution at 130 degrees or wider at 50% peak intensity without additional secondary optical components.

In an embodiment, the A-19 lamp has an outer envelop structure characterized by a diameter of approximately $2\frac{3}{8}$ inches and a base structure that includes an electric socket diameter of 26 mm. In some embodiments, the A-19 lamp includes a plurality of light-emitting diodes (LEDs) disposed over a single recess in a substrate. In another embodiment, the LED emitter is configured to consume electrical power of 40 watts or higher. In some embodiments, the lens is made of a single optically transparent material. In a specific embodiment, the single lens in the emitter lens is wider than the substrate.

The substrate includes a plurality of base layers of an electrically insulating material, a plurality of electrical contacts disposed on a top one of the base layer, and a plurality of electrical paths coupled to the electrical contacts. At least a portion of the plurality of electrical paths is disposed between the base layers. In some embodiments, a diameter of the single lens in the emitter is wider than the recess and is substantially equal to a diagonal dimension of the substrate.

According to another embodiment of the invention, an LED lamp has an outer envelop structure configured for transmission of light therethrough and a base coupled to the outer envelop structure for connecting to an external power source. The LED lamp also has a driver circuit coupled to the base for receiving power from the external power source and an LED emitter disposed inside the outer envelop for receiving regulated power from the driver circuit and for emitting light that is transmitted through the outer envelop structure. The LED emitter includes a plurality of light-emitting diodes (LEDs) disposed over a single recess in a substrate and a single lens disposed over the LEDs and the substrate. The LED lamp is configured to provide light for transmission through the outer envelop structure without additional secondary optical components.

According to yet another embodiment, a multiple-LED emitter is capable of providing high-power wide-angle beam with a single lens. The emitter includes a substrate having a plurality of base layers of an electrically insulating material, a plurality of electrical contacts disposed on a top one of the base layer, and a plurality of electrical paths coupled to the electrical contacts. At least a portion of the plurality of electrical paths is disposed between the base layers. The emitter also has a plurality of light-emitting diodes (LEDs) disposed over the substrate, each of the LEDs being coupled to an electrical contact. The emitter further includes a single lens overlying the plurality of LEDs. The plurality of LEDs are disposed in a recessed region characterized by a first dimension, and the lens is characterized by a circular shape with a diameter that is greater than the first dimension.

A further understanding of the nature and advantages of the present invention may be obtained by reference to the remaining portions of the specification and the drawings.

BRIEF DESCRIPTION OF THE DRAWINGS

FIG. 3A is a simplified top view of a substrate; FIG. 3B is a simplified cutaway top view of the substrate of FIG. 3A; FIG. 3C is a simplified schematic illustration of another configuration of electrical connections among certain components shown in FIG. 3B; and FIG. 3D is a bottom view of the substrate of FIG. 3A;

FIG. 5A is a simplified cross-sectional view illustrating a multi-LED tunable emitter according to an embodiment of the present invention, and FIG. 5B is a simplified cross-sectional view illustrating a conventional emitter with a secondary lens;

FIG. 6 lists performance parameters comparing an LED emitter according to embodiments of the invention with a conventional emitter;

DETAILED DESCRIPTION OF THE INVENTION

The description below is presented with reference to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

Figure 1:
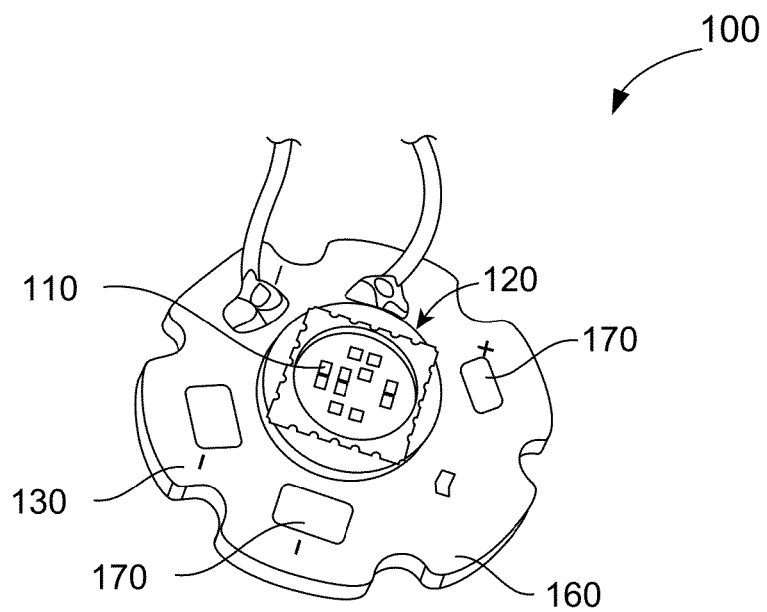
FIG. 1 is a simplified cross-sectional view illustrating an A-19 light bulb having a high-power LED emitter according to an embodiment of the present invention.

FIG. 1 is a simplified cross-sectional view illustrating an A-19 light bulb having a high-power light-emitting diode (LED) emitter according to an embodiment of the present invention. As shown in FIG. 1, emitter module 100 includes a multiple-LED emitter 120 overlying a circuit board 130. Emitter 120 has two or more groups of light-emitter diodes (LEDs), with each group including one or more LEDs. Emitter 120 also has a single lens 110 disposed over the LEDs. As described below with reference to FIGS. 2A-3D, the groups of LEDs are individually addressable. In other words, each group can receive a different amount of electric current for adjusting its brightness. Emitter 120 also includes a plurality of contacts 170 for feeding electric current to the two or more groups of LEDs. By supplying different electrical currents to the groups of LEDs, emitter 120 can be configured to produce different output light colors.

In some embodiments, emitter 120 includes a substrate on which the two or more groups of light-emitter diodes (LEDs) are disposed. In an embodiment, the substrate has a plurality of base layers of an electrically insulating material, a plurality of electrical contacts disposed on a top one of the base layer, and a plurality of electrical paths coupled to the electrical contacts. At least a portion of the plurality of electrical paths is disposed between the base layers. Each of the LEDs being coupled to an electrical contact, and the electrical paths are configured for feeding separate electrical currents to the two or more groups of LEDs. Circuit board 130 can be a metal core printed circuit board (MCPCB), on which the substrate is located. More details about the substrate and the circuit board are described below with reference to FIGS. 2-4.

Figure 2A:
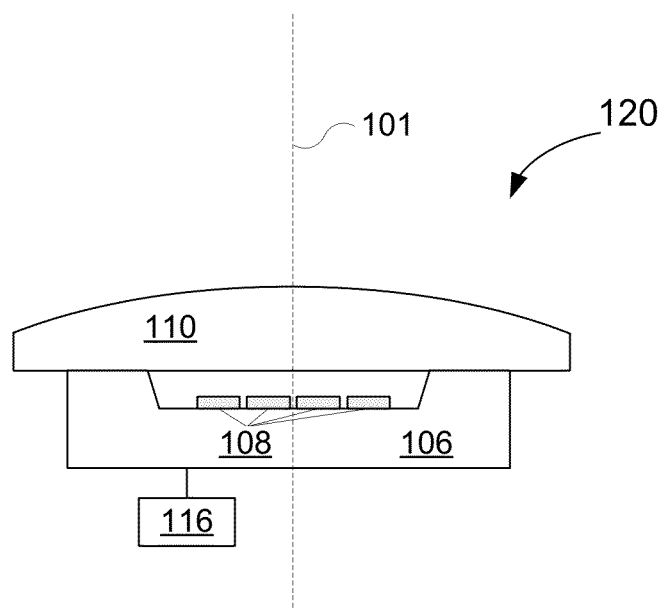
FIG. 2A is a simplified cross-sectional view illustrating a multi-LED emitter that can be used in the LED A-19 lamp of FIG. 1 according to an embodiment of the present invention.

FIG. 2A illustrates a simplified cross-sectional side view of a multi-LED emitter 120 that can be used in emitter module 100 of FIG. 1 according to an embodiment of the present invention. In FIG. 2A, emitter 120, which can be symmetric about an axis 101 (other shapes can also be used), includes a substrate 106 on which are mounted individual LEDs 108. Each LED 108 can be a separate semiconductor die structure fabricated to produce light of a particular color in response to electrical current. In some embodiments, each LED 108 is coated with a material containing a color-shifting phosphor so that LED 108 produces light of a desired color. For example, a blue-emitting LED die can be coated with a material containing a yellow phosphor; the emerging mixture of blue and yellow light is perceived as white light having a particular color temperature.

In some embodiments, emitter 120 also includes a control circuit 116 that controls, among other things, the power provided from an external power source (not shown) to LEDs 108. As described below, control circuit 116 advantageously allows different amounts of power to be supplied to different LEDs 108.

A primary lens 110, which can be made of glass, plastic, or other optically transparent material, is positioned to direct light emitted from LEDs 108 to the desired direction. In conventional LED-based light devices, a secondary optics is usually disposed over the primary lens. Some secondary optics 112 include a total-internal-reflection (TIR) lens that also provides mixing of the colors of light emitted from LEDs 108 such that the light beam exiting through its front face has a uniform color. In embodiments of the invention, 110 primary lens is configured to also provide the mixing function, such that no secondary optics is needed.

Embodiments of the present invention provide substrates and packages for LED-based light devices that can significantly improve thermal performance, allowing the LEDs to operate at higher current and therefore higher brightness. In addition, some embodiments provide improved electrical properties by providing separate electrical and thermal paths through the substrate. The separation of electrical and thermal paths further allows different operating current to be supplied to different LEDs, enhancing the ability to control the light output of the device.

Figure 2B:
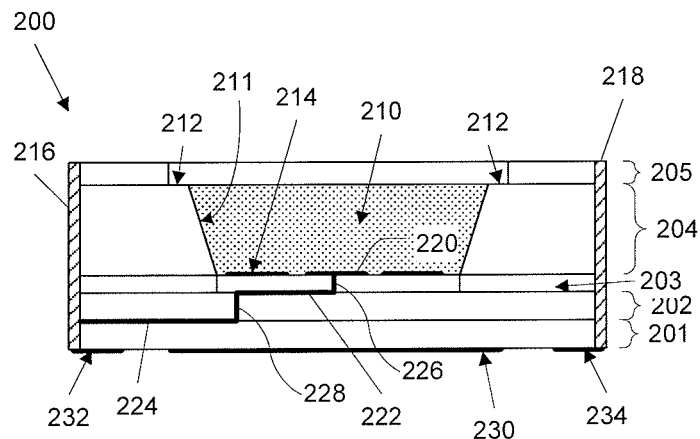
FIG. 2B is a simplified cross-sectional view illustrating a substrate that may be used in the multi-LED emitter module of FIG. 1.

FIG. 2B is a simplified side view of a substrate 200 for a multi-LED emitter according to an embodiment of the present invention. Substrate 200 is formed as a series of layers 201-205 of a ceramic material (e.g., alumina or aluminum nitride (AlN)). Layers 201-205 have different thicknesses that can be optimized to control thermal expansion and thermal stress. For example, layers 201 and 202 can be 0.15 millimeters (mm) each, layer 203 can be 0.10 mm, layer 204 can be 0.50 mm, and layer 205 can be 0.15 mm, for a total thickness of 1.05 mm.

Upper layers 204 and 205 define a recess 210 within which one or more LEDs (not shown) can be placed. In one embodiment, recess 210 has the shape of a truncated cone; sidewall 211 is circular and slanted inward, e.g., at an angle of about 20° with respect to the vertical axis. Sidewall 211 of recess 210 can be coated with a reflective material (e.g., silver) to increase light output of the device.

Upper layer 205 can provide a circular opening, allowing light to escape from recess 210. In this embodiment, the edge of layer 205 is set back from the edge of layer 204 at the periphery of recess 210, thereby forming a ledge 212 upon which a primary lens can be placed.

Layers 201-203 provide a base for the package. A patterned metal layer 214 is deposited on top-most base layer 203 within recess 210. Patterned metal layer 214 provides various bond pads (e.g., pad 220) for electrical contacts to LEDs disposed within recess 210. (These are referred to herein as "top-side" bond pads because they are on the topmost one of the base layers.) Specific examples are described below, but it will be appreciated that the present invention is not limited to any particular configuration of bond pads or of metal layer 214.

External electrical contacts 216, 218 are provided at a peripheral edge of substrate 200. In one embodiment, external contacts 216, 218 include metal coatings that extend vertically along the entire thickness of substrate 200. Any number of external contacts can be provided. Each top-side bond pad of patterned metal layer 214 can be connected to one (or more) of the external electrical contacts, e.g., using metal lines disposed between ceramic layers and metal vias passing through the ceramic layers. By way of illustration, FIG. 2A shows top-side bond pad 220 connected to external contact 216 by interlayer metal lines 222, 224 and vias 226, 228. Any configuration of connections may be used. Further, in some embodiments, some of the top-side bond pads can be connected to each other by interlayer metal lines and vias that do not connect to external electrical contacts. In some embodiments, as described below, the electrical connections are arranged such that power can be supplied separately to different LEDs or groups of LEDs. In some embodiments, external contacts 216, 218 may also extend inward on the bottom surface of substrate 200, e.g., as bottom metal pads 232 and 234.

A metal plate 230 is disposed on the bottom surface of bottom layer 201. Metal plate 230, which is advantageously circular and as large as possible in some embodiments, provides a metallic surface for attaching a heat sink. Metal plate 230 is also advantageously electrically isolated from the various electrical paths and pads that may be present on, within, and/or under substrate 200.

Figure 2C:
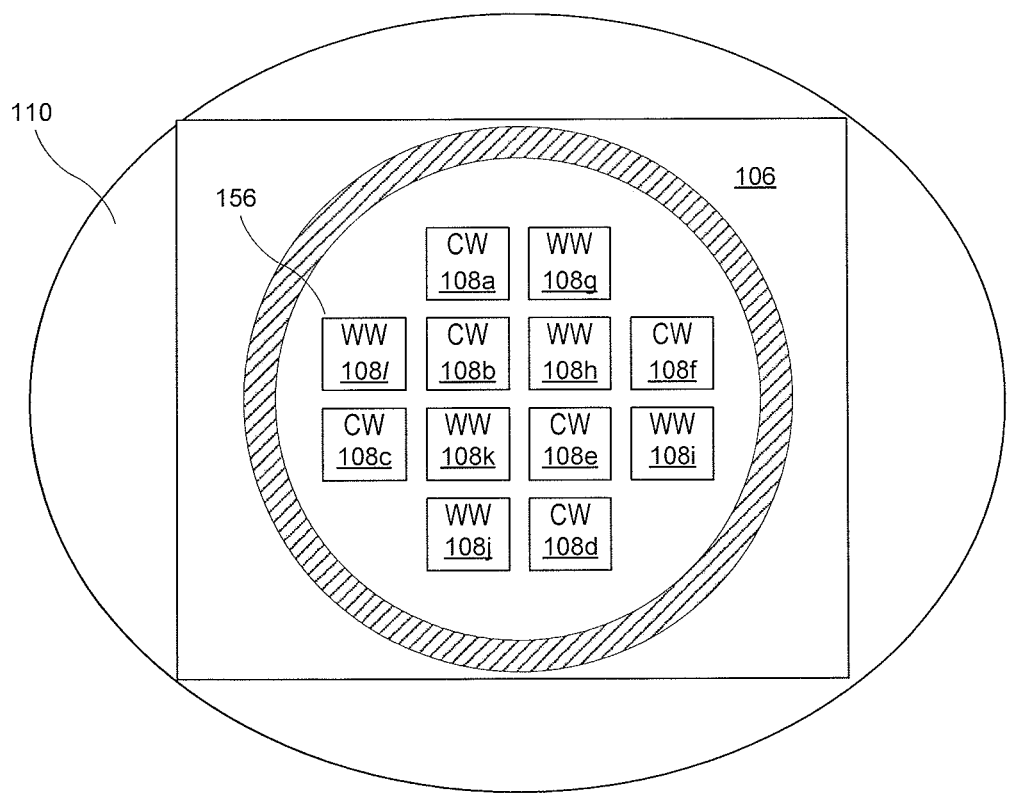
FIG. 2C is a simplified top view of a substrate holding LEDs that may be used in the multi-LED emitter module of FIG. 1.

Substrate 200 can be used to support any number and arrangement of LEDs. Specific examples include 4-LED, 12-LED, and 16-LED configurations. An example is illustrated in FIG. 2C, which is a top view of substrate 106 in FIG. 2A according to an embodiment of the present invention. Those skilled in the art with access to the present teachings will understand that many other configurations are also possible.

In some embodiments LEDs 108 advantageously include both "warm" and "cool" white LEDs. As shown in FIG. 2C, twelve LEDs 108a-l are arranged within a recess 156 on substrate 106. In this example, six of the LEDs are cool white ("CW") LEDs 108a-f; the other six are warm white ("WW") LEDs 108g-l. "Cool" white and "warm" white, as used herein, refer to the color temperature of the light produced. Cool white, for example, can correspond to a color temperature above, e.g., about 4000 K, while warm white can correspond to a color temperature below, e.g., about 3000 K. In some embodiments, it is desirable that cool white LEDs 108a-f have a color temperature cooler than a target color temperature for lamp 100 while warm white LEDs 108g-l have a color temperature warmer than the target color temperature. When light from cool white LEDs 108a-f and warm white LEDs 108g-l is mixed by mixing lens 112, the target temperature can be achieved. More generally, for purposes of providing a tunable emitter, the emitter can include LEDs belonging to any number of "groups," with each group being defined as producing light within a different color or color temperature range (or "bin"); the ranges associated with different groups advantageously do not overlap, and the desired color or color temperature to which the lamp will be tuned is somewhere between the colors or color temperatures associated with the groups of LEDs.

Figure 2D:
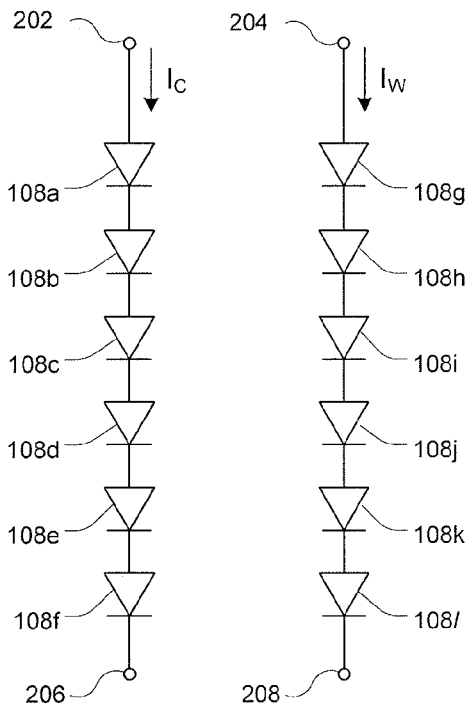
FIGS. 2D and 2E illustrate examples of electrical connectivity that can be used to provide independent addressability of warm white and cool white LEDs according to an embodiment of the present invention.
Figure 2E:
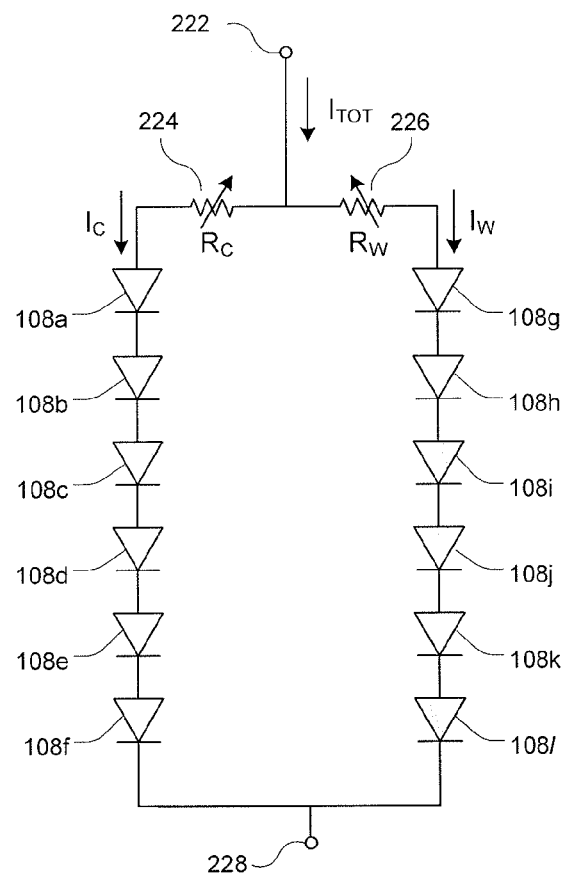

To facilitate achieving a desired color temperature, the LEDs 108 of emitter 120 are advantageously connected such that cool white LEDs 108a-f and warm white LEDs 108g-l are independently addressable, i.e., different currents can be supplied to different LEDs. FIGS. 2D and 2E are simplified schematics illustrating examples of electrical connectivity that can be used to provide independent addressability of warm white and cool white LEDs. These electrical connections can be implemented, e.g., using traces disposed on the surface of substrate 106 and/or between electrically insulating layers of substrate 106. Examples of substrates that provide independent addressability for groups of LEDs are described in U.S. patent application Ser. No. 12/756,861, U.S. Patent App. Pub. No. 2010/0259930; other substrates can also be used.

FIG. 2C also shows contour of lens 110 superimposed over substrate 106 to illustrate the relative dimensions of the lens, the recess, and the substrate in some embodiments. It can be seen that the diameter of lens 110 is greater than the diameter of the recess. Further, in this particular embodiment, the diameter of the lens is substantially equal to a diagonal dimension of th substrate. As described below, the size and shape of the lens are selected to provide wide-angle light output without the need for a secondary lens.

In FIG. 2D, cool white LEDs 108a-f are connected in series between a first input node 202 and a first output node 204; warm white LEDs 108g-l are connected in series between a second input node 206 and a second output node 204. Consequently, one current ($I_C$) can be delivered to cool white LEDs 108a-f while a different current ($I_W$) is delivered to warm white LEDs 108g-l. The currents $I_C$ and $I_W$ can be independently controlled, thereby allowing the relative brightness of cool white LEDs 108a-f and warm white LEDs 108g-l to be controlled; this provides control over the color temperature of light produced by emitter 120. For example, control circuit 116 (FIG. 2A) can be connected to nodes 202 and 206 and to nodes 204 and 208 to deliver the desired currents $I_C$ and $I_W$.

FIG. 2E illustrates one specific technique for implementing per-group current control. As in FIG. 2D, cool white LEDs 108a-f are connected in series, and warm white LEDs 108g-l are also connected in series. In FIG. 2B, the last LEDs in each series (LEDs 108f and 108l) are connected to a common output node 228. A common input node 222 receives a total current $I_{TOT}$, which is divided between cool white LEDs 108a-f and warm white LEDs 108g-l using potentiometers (or variable resistors) 224, 226. Potentiometer 224 can be set to a resistance $R_C$ while potentiometer 226 can be independently set to a resistance $R_W$; as a result, a current $I_C$ is delivered to cool white LEDs 108a-g while a current $I_W$ is delivered to warm white LEDs 108g-l. By controlling $R_W$ and $R_C$, $I_{TOT}$ can be divided between $I_W$ and $I_C$ in a controllable proportion according to the property that $I_W/I_C=R_C/R_W$. Thus, as in FIG. 2D, the relative brightness of cool white LEDs 108a-f and warm white LEDs 108g-l can be controlled, thereby providing control over the color temperature of light produced by lamp 100. In one embodiment, control circuit 116 can be connected to nodes 222 and 228 to supply current $I_{TOT}$, and further connected to control resistances $R_C$ and $R_W$.

Other addressing schemes can also be used; for example, each of the LEDS 108a-l can be independently addressable.

It will be appreciated that emitter 120 described herein is illustrative and that variations and modifications are possible. Those skilled in the art with access to the present teachings will recognize that any lamp that has independently addressable warm white and cool white LEDs can also be used; thus, details of the lamp are not critical to understanding the present invention.

In accordance with some embodiments of the present invention, the currents $I_C$ and $I_W$ (shown in FIGS. 2D and 2E) can be efficiently tuned so that the light output from emitter 120 has a desired color temperature. The tuning process advantageously requires only a small number (e.g., three or four) of measurements and does not rely on trial-and-error. The process can also be automated to allow tuning of a large number of lamps in a mass-production environment; thus, color tuning can be incorporated into lamp production, e.g., as a stage in an assembly line.

Emitter 120 can be placed into a tuning apparatus and color-tuned during production. Thereafter, emitter 120 can be configured to operate at the desired color temperature simply by maintaining the division (or distribution) of current determined in the tuning process. Provided that the LEDs in emitter 120 can maintain a stable color temperature over time, no further tuning or active feedback is needed during normal emitter operation. Since active feedback is not needed, the cost of manufacture can be reduced as compared to emitters that require active feedback to maintain a stable color temperature. The tuning process can also be used to identify different current distributions for different target colors.

In general, the relationship between a change in the relative currents supplied to the warm and cool LEDs and the resulting shift in color temperature is nonlinear. Further, the magnitude of the shift in color temperature resulting from a given change in relative current varies from one lamp to another. However, according to embodiment of the invention, over a sufficiently narrow range of color space, the relationship can be approximated as linear. Examples of tuning techniques based on this property are described in U.S. patent application Ser. No. 13/106,808, Attorney Docket No.: 91924-793987 (001200US), filed May 12, 2011, entitled "Tuning Of Emitter With Multiple LEDS To A Single Color Bin."

Figure 3A:
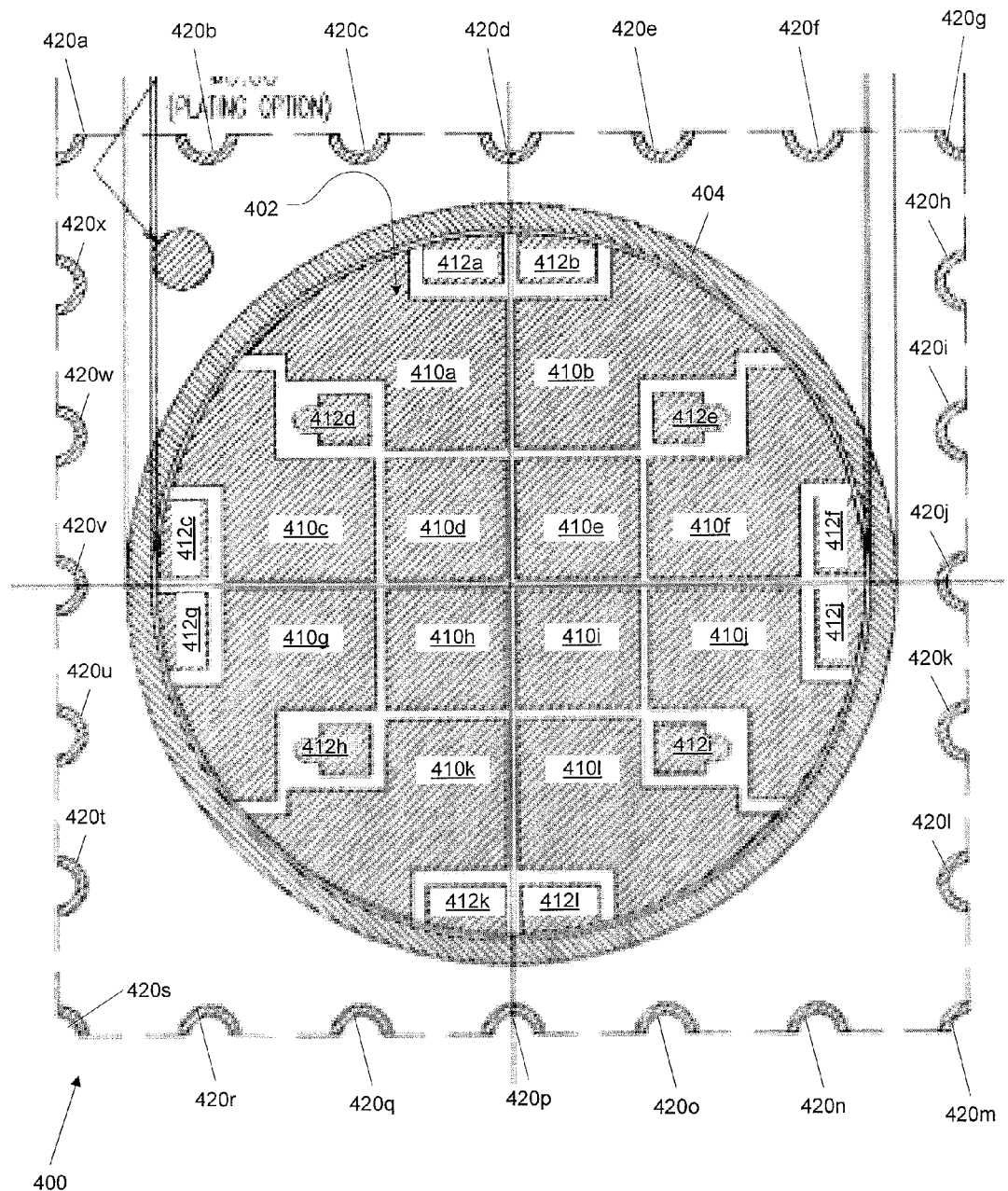
FIGS. 3A-3D illustrate a 12-LED package according to an embodiment of the present invention. More specifically.

In embodiments of the invention, the tuning is facilitated by arranging the substrate to provide individual access and control of the LED dice. FIG. 3A is a simplified top view of a substrate 400 for a 12-LED package according to another embodiment of the present invention. Substrate 400, viewed from the top, can be a square of any size desired, e.g., about 0.7-5 cm on a side; in one embodiment, the square is about 9 mm on a side. Its thickness can be, e.g., about 0.5-2 mm or other thickness as desired; in one embodiment, the thickness is between 0.7-1 mm. Like substrate 200 of FIG. 2B, substrate 400 is formed as a set of ceramic layers. A recess 402 is defined by an angled sidewall 404 and optionally surrounded by a ledge (not explicitly shown), similar to recess 210 and ledge 212 of FIG. 2B. Top-side bond pads, which include LED bond pads 410a-l and wire bond pads 412a-l, are disposed within the recess. In this embodiment, twenty-four peripheral bond pads 420a-x are provided for external electrical contacts. Twelve LEDs (not shown in FIG. 3A) can be bonded to LED bond pads 410a-l and connected, e.g., via wire bonds, to wire bond pads 412a-l, as shown in FIG. 3B and described below.

Depending on how the LEDs are connected and how top-side bond pads 410a-l, 412a-l are electrically coupled to peripheral bond pads 420a-x, a number of electrical configurations are possible.

Figure 3B:
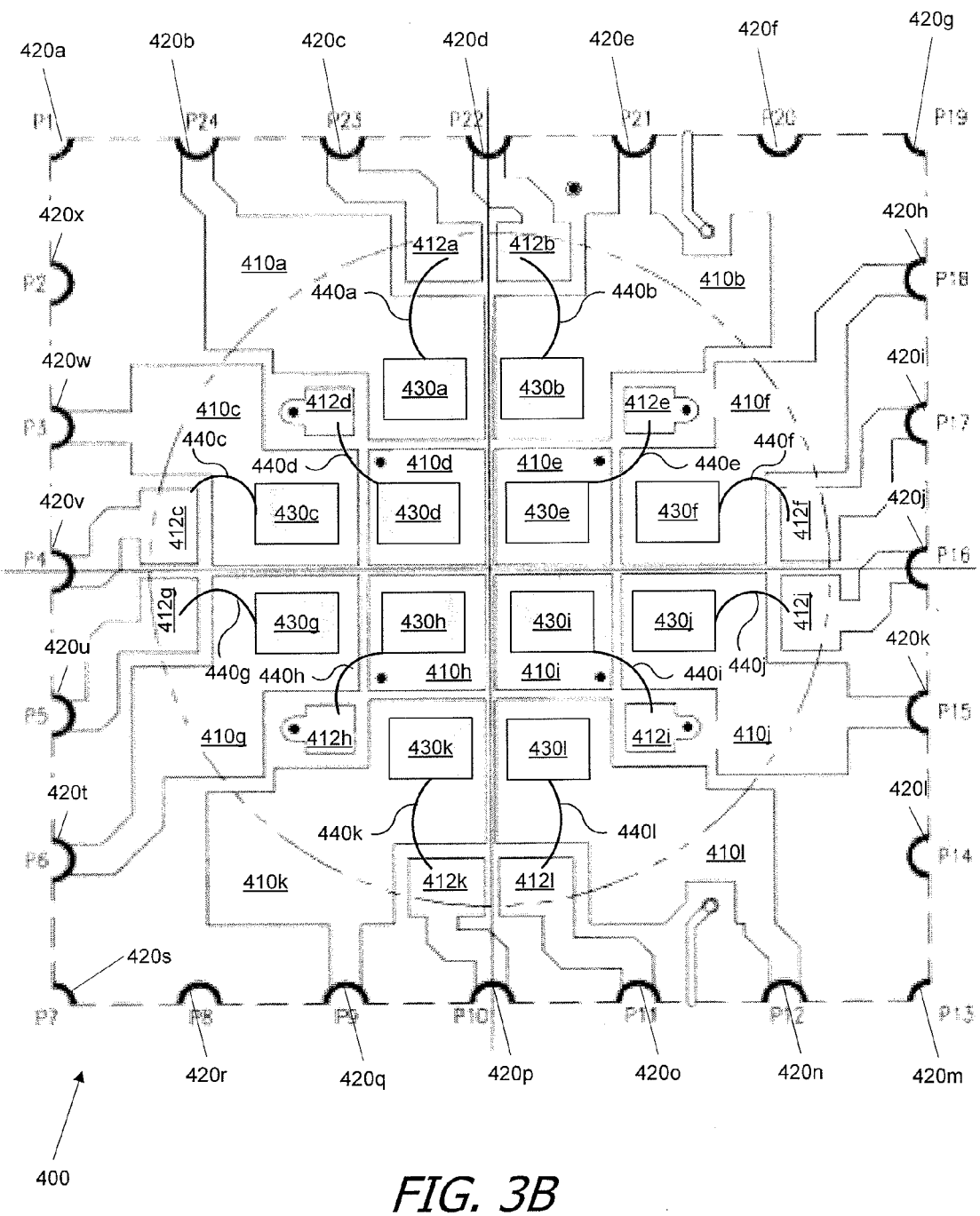

For example, FIG. 3B is a cutaway top view of substrate 400, with the upper layers forming sidewall 404 (e.g., corresponding to layers 204 and 205 of FIG. 2B) removed. The inner periphery of recess 402 is indicated by broken line 403. As can be seen, some of top-side bond pads 410a-l, 412a-l can extend outward beyond the boundary of recess 402, further spreading heat across more of the upper surface of ceramic substrate 400. In addition, some of top-side bond pads 410a-l, 412a-l, can connect to some of peripheral bond pads 420a-x without the use of vias or metal interconnects between other layers. Connections to the remaining bond pads are not explicitly shown in FIG. 3B. It is to be understood that paths not shown in FIG. 3B may be implemented using vias and metal interconnect between the ceramic layers (e.g., as illustrated in FIG. 2B). For example, metal interconnects may be created on a layer below the layer seen in FIG. 3B and connected to the various pads by vias.

FIG. 3B also shows how twelve LEDs 430a-l can be placed and electrically connected to substrate 400 according to an embodiment of the present invention. In this embodiment, each of LEDs 430a-l has an electrical contact on its bottom surface (not explicitly shown) and a top pad (also not explicitly shown) for a wire bond 440a-l.

The pad configuration of FIG. 3B can provide a separate, independently controllable, electrical connection path for each of the twelve LEDs 430a-l. (Herein, LEDs or groups of LEDs with a separate electrical connection path are referred to as being "independently addressable.") For example, peripheral bond pad 420b connects to LED bond pad 410a. LED 430a is connected between LED bond pad 410a and wire bond pad 412a by wire bond 440a. Wire bond pad 412a connects to peripheral bond pad 420c. Likewise, peripheral bond pad 420w connects to LED bond pad 410c. LED 430c is connected between bond pad 410c and bond pad 412c by wire bond 440c. Bond pad 412c is connected to peripheral bond pad 420v. Further, peripheral bond pad 420x connects to LED bond pad 410d (the connection is not explicitly shown). LED 430d is connected between LED bond pad 410d and wire bond pad 412d by wire bond 440d. Wire bond pad 440d connects to peripheral bond pad 420a (again, the connection is not explicitly shown). Similarly, each other LED 430 is electrically coupled between a different pair of peripheral bond pads.

Figure 3C:
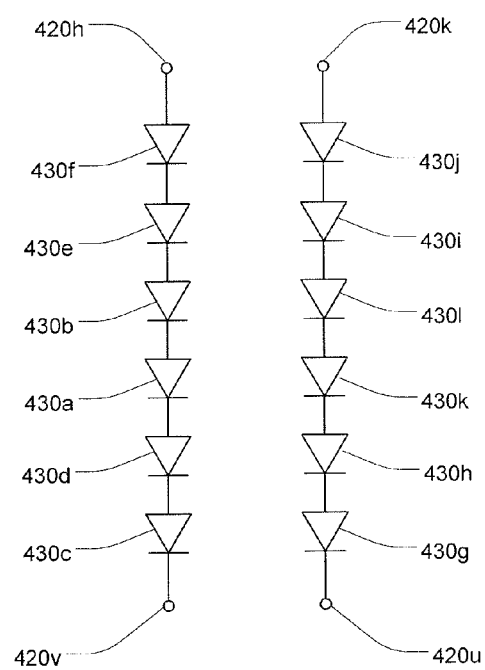

Thus, LEDs 430a-l are each individually addressable; this is also illustrated schematically in FIG. 3C. In this configuration, applying a potential difference across the appropriate pair of peripheral bond pads will provide power to one of the twelve LEDs 430a-l. The individually addressable connections to the LEDs provide flexibility to make connections outside of the package and thereby connect the LEDs together in different groups. For example, LEDs 430a-l could be connected into four groups of three LEDs each or two groups of six LEDs each. The LEDs within a group can be connected in series or in parallel as desired. For example, FIG. 3C is a schematic diagram illustrating a configuration with two groups of six LEDs 430 a-l connected in series according to an embodiment of the present invention.

In still other embodiments, series or parallel connections of multiple LEDs can be "built in" to the substrate. For example, if a wire bond pad (e.g., pad 412d) were electrically connected to an LED bond pad (e.g., pad 410c), a serial connection would be permanently defined for LEDs 430c, 430d. Such a connection can be made directly between the pads, or indirectly using vias and metal interconnects between base layers of substrate 400.

Referring again to FIG. 3B, it should be noted that LED bond pads 410a-l are advantageously made as large as possible and can be substantially larger than LEDs 430a-l. The large area of the LED bond pads allows heat generated by LEDs 430a-l to spread quickly across the upper surface of the ceramic substrate, increasing the amount of heat that can be transferred vertically through the substrate.

Figure 3D:
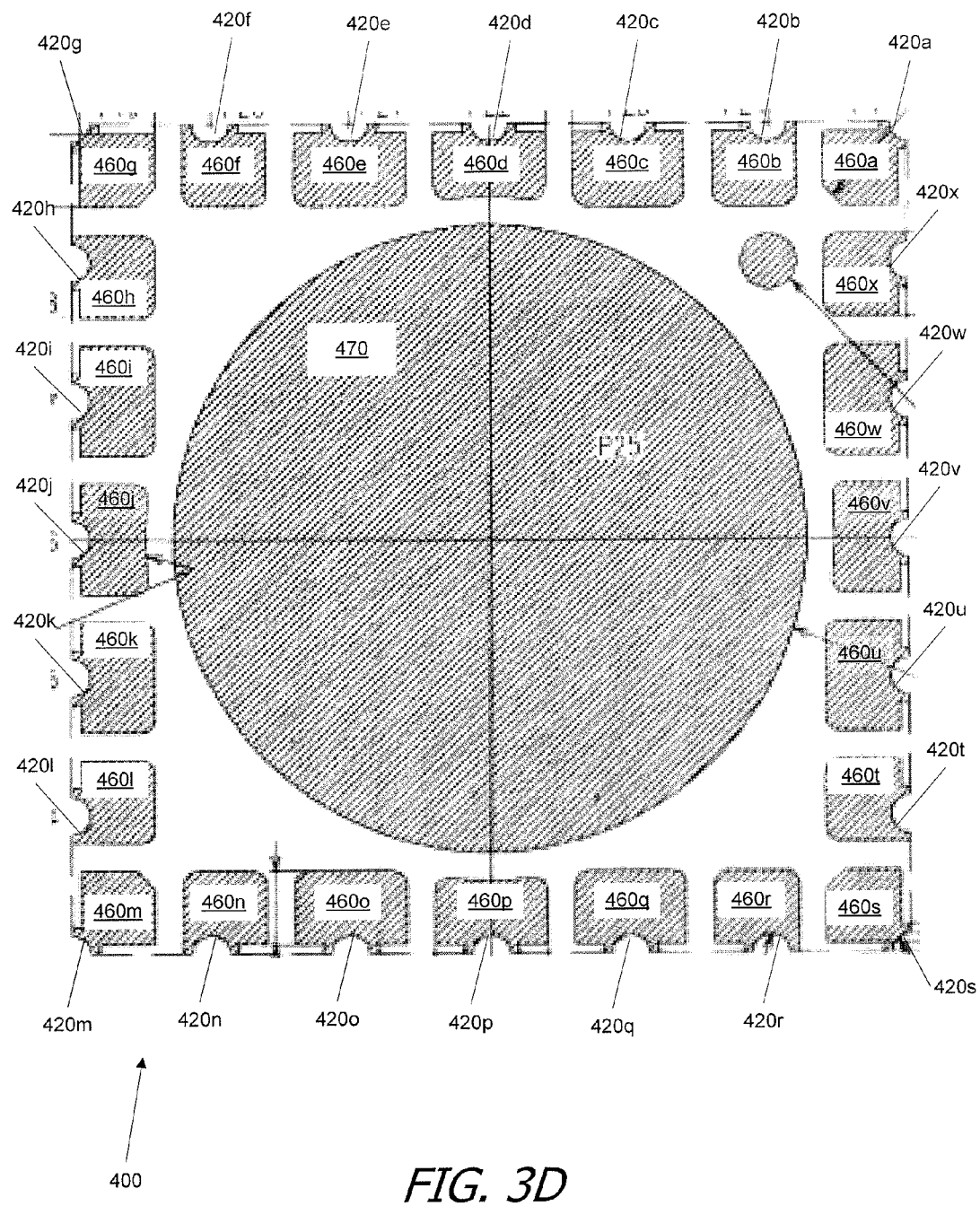

FIG. 3D is a bottom view of substrate 400 of FIG. 3A. A metal region 470, which is advantageously circular and as large as possible is centered relative to recess 402 (FIG. 3A). Metal region 470 acts as a heat dissipation plate. A heat sink can be placed in thermal contact with metal region 470 to further dissipate heat.

Peripheral bond pads 420a-x can extend along the entire vertical thickness of substrate 400 (similar to substrate 200 of FIG. 2A) and can be connected to bottom pads 460a-x. External electrodes (e.g., wires) can be connected directly to peripheral bond pads 420a-x and/or to bottom pads 460a-x as desired.

It should be noted that metal region 470 is not electrically coupled to any of peripheral bond pads 420a-x, bottom pads 460a-x, or top-side bond pads 410a-l, 412a-l. Thus, metal region 470, in conjunction with the thermally conductive ceramic body of substrate 400, provides a thermal path that is separate from the electrical path.

Figure 4A:
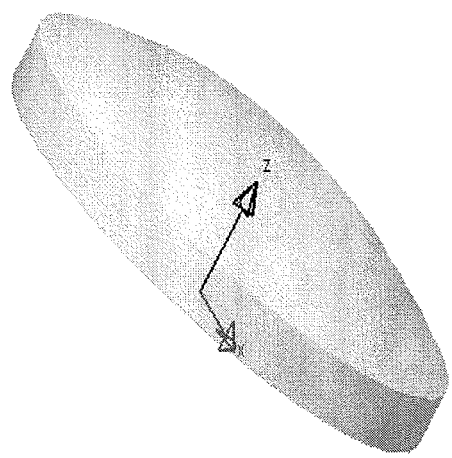
FIG. 4A is a perspective view illustrating a lens usable in some embodiments of the present invention.
Figure 4B:
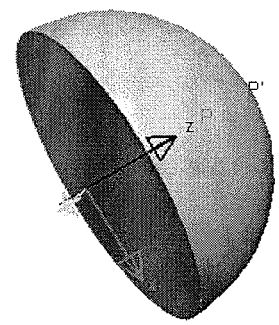
FIG. 4B is perspective view illustrating a conventional lens for an LED emitter.

FIG. 4A is a perspective view illustrating a lens 300 usable in some embodiments of the present invention. In contrast, FIG. 4B is perspective view illustrating a conventional lens 350 for an LED emitter. In a specific embodiment, lens 300 is designed for a 12-LED emitter with a 12 mm×12 mm substrate, and has a flat circular shape with a diameter of 12 mm and a height of 2.8 mm. In contrast, conventional lens 350 has a spherical shape and a diameter of about 7.4 mm. Additional properties and performance parameters are described below in connections with the emitters. For example, the shape and size of lens 300 are selected to enable the emitter to provide wide-angle light output.

Figure 5A:
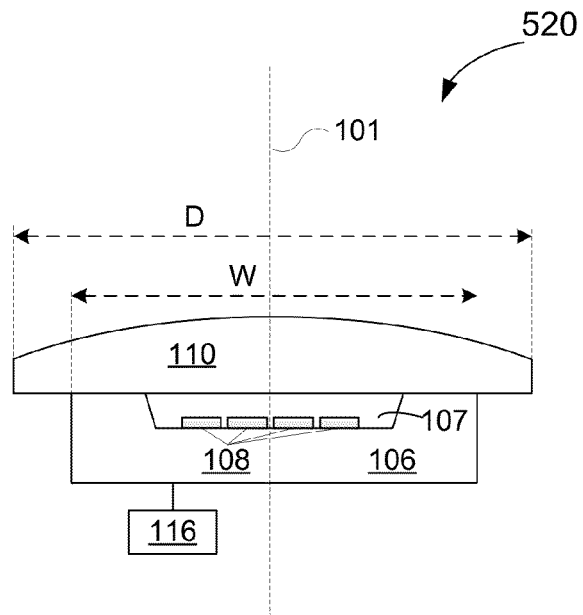
FIGS. 5A and 5B compare an emitter according to embodiments of the invention to a conventional emitter. More specifically.
Figure 5B:
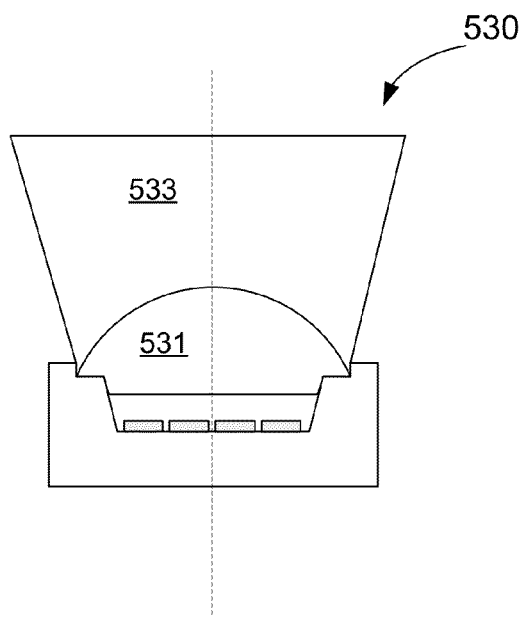

FIGS. 5A and 5B are cross-sectional views illustrating an LED emitter according to embodiments of the invention and a conventional emitter with a secondary lens, respectively. As shown, LED emitter 520 in FIG. 5A is similar to LED emitter 120 depicted in FIG. 2A. Multiple-LED emitter 520 is capable of providing high-power wide-angle beam with a single lens. The emitter includes a substrate 106 having a plurality of base layers of an electrically insulating material. As described above in connection with FIG. 2B, substrate 106 has a plurality of electrical contacts disposed on a top one of the base layer and a plurality of electrical paths coupled to the electrical contacts. At least a portion of the plurality of electrical paths is disposed between the base layers. Moreover, the emitter also has a plurality of light-emitting diodes (LEDs) 108 disposed over substrate 106, each of the LEDs being coupled to an electrical contact. Emitter 520 further includes a single lens 110 overlying the plurality of LEDs.

In some embodiments, the plurality of LEDs is disposed in a recessed region 107. In FIG. 5A, substrate 106 is characterized by a first width dimension "W". The lens is characterized by a circular shape with a diameter "D" that is greater than the first width dimension "W". It can also be seen that "D" is wider than the dimension of the recess. In some embodiments, lens diameter "D" is substantially equal to a diagonal dimension of the substrate, as illustrated in FIG. 2C. In embodiments of the invention, the shape and dimension of the lens are selected to enable the emitter to provide wide-angle light output without any secondary optics. As described below in connection with FIGS. 6 and 7, emitter 520 with a single lens 110 is capable of producing high-power wide angle light output. In contrast, convention emitter 530 has a spherical primary lens 531 and often needs a secondary lens 533 to obtain proper color mixing and uniform brightness. Further, conventional primary lens 531 is often inadequate for wide-angle light output required in many lighting applications, such as A-19 lamp.

FIG. 6 lists performance parameters comparing LED emitter 520 according to embodiments of the invention with conventional emitter 530. It can be seen that emitter 520 provide substantially better wide-angle output. The view angle at 50% light intensity from the center is 130 degrees, and the view angle at 20% light intensity from the center is 180 degrees. In contrast, conventional emitter 530 has a view angle of 110 degrees at 50% light intensity from the center and a view angle of 135 degrees at 20% light intensity from the center. In FIG. 6, emitter 520 is shown to have slightly less Lumen output compared with conventional emitter 530 without a secondary lens. But emitter 520 is still more effective for wide-angle applications. Since conventional emitter 530 can not provide wide-angle light output needed in an A-19 lamp, a secondary lens will be needed for such applications. A secondary lens often delivers 80% optical efficiency, resulting in a 20% light loss. In embodiments of 40 W emitters, emitter 520 can offer about 15% greater optical efficiency comparing with a conventional 40 W emitter with a secondary lens.

Figure 7A:
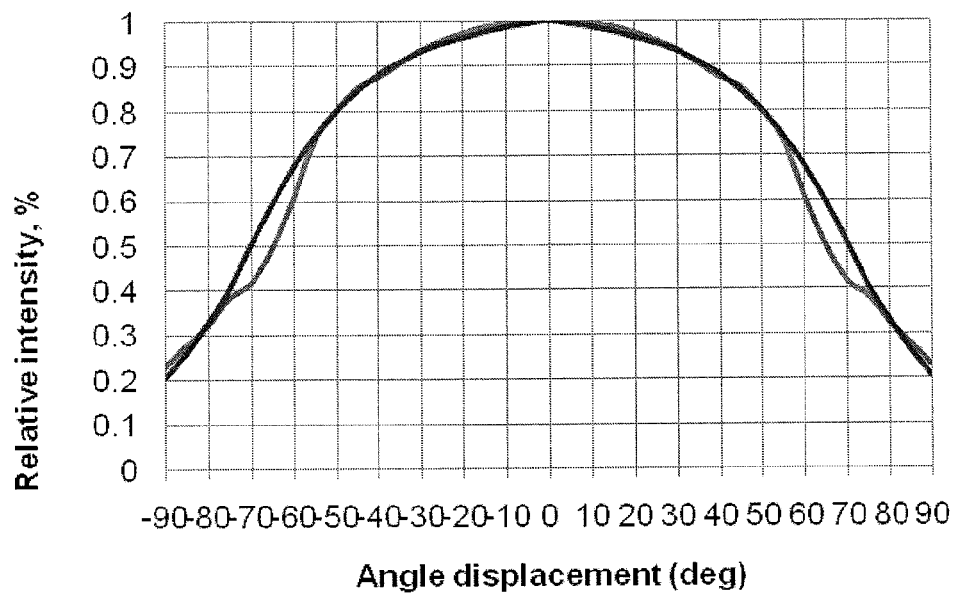
FIGS. 7A and 7B show plots of light intensity distribution over angle displacement for an LED emitter according to an embodiment of the invention and a conventional LED emitter, respectively.
Figure 7B:
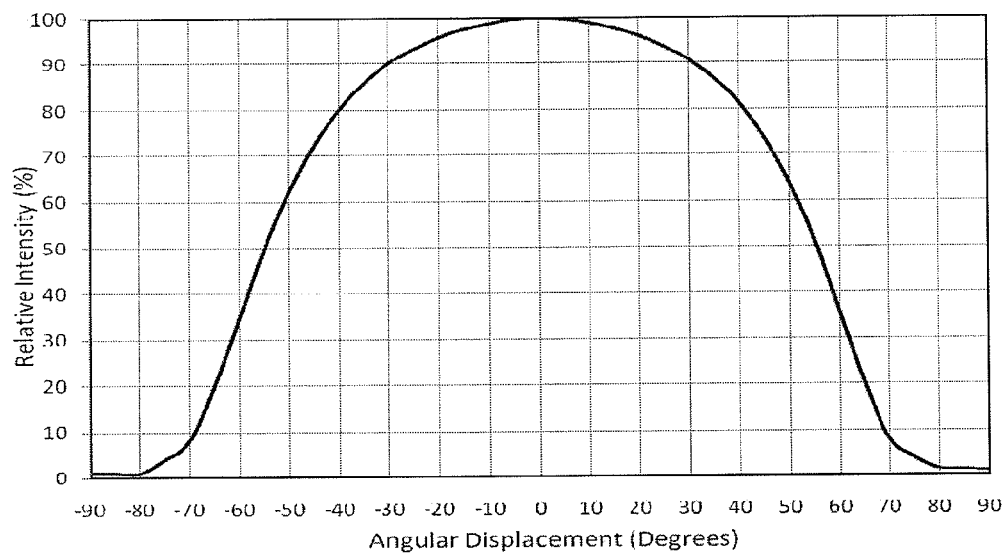

FIG. 7A shows light intensity distribution over angle displacement relative to the center point for LED emitter 520 according to embodiments of the invention, and FIG. 7B shows light intensity distribution over angle displacement relative to the center point for conventional LED emitter 530. Again, it can be seen that, for emitter 520, the view angle at 50% light intensity from the center is 130 degrees, and the view angle at 20% light intensity from the center is 180 degrees. In contrast, conventional emitter 530 has a view angle of 110 degrees at 50% light intensity from the center and a view angle of 135 degrees at 20% light intensity from the center.

Figure 8:
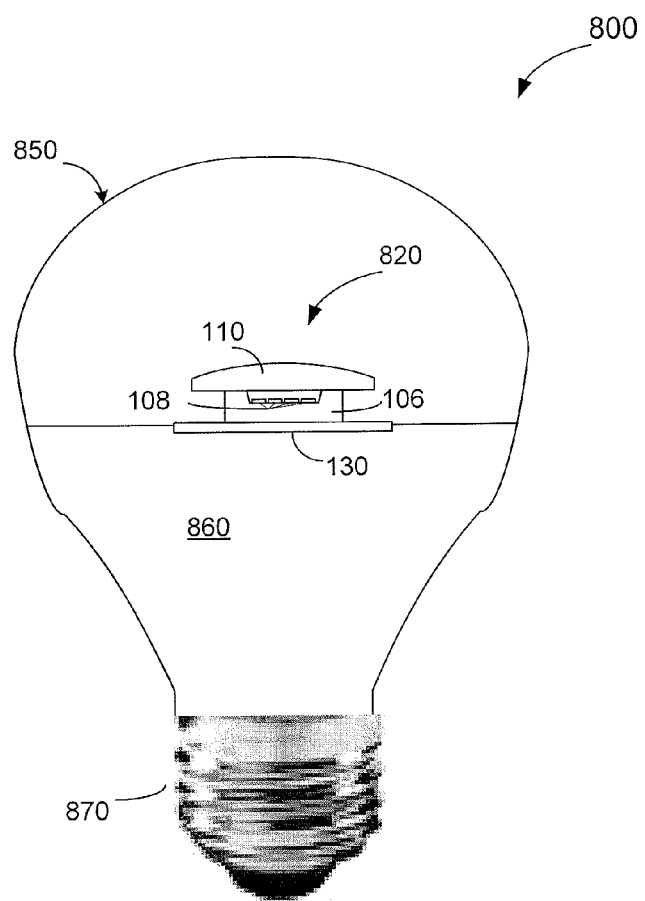
FIG. 8 is a simplified cross-sectional view illustrating an LED A-19 light bulb according to an embodiment of the present invention.

FIG. 8 is a simplified cross-sectional view illustrating an A-19 light bulb with a single emitter and without secondary optics according to an embodiment of the present invention. The LED A-19 lamp can replace the conventional incandescent A-19 lamp lower power consumption and higher energy efficiency. LED A-19 lamp 800 includes a lamp envelop structure 850 configured for transmission of light therethrough and a base structure 860 coupled to a lower portion of the lamp envelop structure. In FIG. 8, lamp envelop structure 850 is shown to have a shape similar to a conventional A-19 lamp, but other suitable shapes can also be used. As shown, base structure 860 also includes a socket 870 for coupling to an external power source.

The dimensions of the lamp envelop structure and the base structure are configured to conform to requirement of a conventional A-19 lamp. For example, the widest part of the A-19 lamp envelop structure is usually 19/8 of an inch, or 2 3/8 inches, and the diameter of the base structure usually fits into an electric socket with a diameter of 26 mm for an E26 socket often used with A-19 lamps. It is appreciated that the LED A-19 lamp can have dimensions that can differ from the standard dimensions, but still can replace conventional A-19 lamp in various applications. It is also noted that the components shown in FIG. 8 are drawn for illustrative purposes and are not necessarily in scale.

In FIG. 8, a high-power wide-angle A-19 lamp 800 needs only a single LED emitter 820 having multiple LEDs 108. Emitter 820 also has a substrate disposed 106 on a circuit board 130. Emitter 820 is similar to emitter 120 described above in connection with FIGS. 1, 2, and 5A. For example, substrate 106 includes a plurality of base layers of an electrically insulating material, a plurality of electrical contacts disposed on a top one of the base layer, and a plurality of electrical paths coupled to the electrical contacts. At least a portion of the plurality of electrical paths is disposed between the base layers.

The LED A-19 lamp described above also has a driver circuit (not shown, but can be disposed on circuit board 130) coupled to the base for receiving power from the external power source and an LED emitter disposed inside the lamp envelop structure for receiving regulated power from the driver circuit and for emitting light that is transmitted through the lamp envelop structure. In a specific embodiment, the emitter is configured to consume electrical power of 20 Watts or higher and to provide light distribution at 130 degrees or wider at 50% peak intensity without additional secondary optical components.

In another embodiment, the LED emitter is configured to consume electrical power of 40 watts or higher. In some embodiments, the lens is made of a single optically transparent material. In a specific embodiment, the single lens in the emitter lens is wider than the substrate.

In the above description, specific circuits and examples are used to illustrate the embodiments, it is understood that the examples and embodiments described herein are for illustrative purposes only and that various modifications or changes in light thereof will be suggested to persons skilled in the art and are to be included within the spirit and purview of this invention.

What is claimed is:

1. An LED (light-emitting diode) high-power wide-angle A-19 lamp, comprising:
   a lamp envelope structure configured for transmission of light therethrough;
   a base structure coupled to a lower portion of the lamp envelope structure for coupling to an external power source;
   a driver circuit coupled to the base for receiving power from the external power source; and
   a single LED emitter disposed inside the A-19 lamp for receiving regulated power from the driver circuit and for emitting light that is transmitted through the lamp envelope structure, wherein the LED emitter comprises:
   a plurality of light-emitting diodes (LEDs) disposed in a single recess in a substrate, each LED being coated with a material containing a color-shifting phosphor; and
   a single lens disposed over the LEDs and the substrate, the single lens being made of an optically-transparent material and without additional color-shifting phosphor;
   wherein the emitter is configured to consume electrical power of 30 Watts or higher and to provide light distribution at 130 degrees or wider at 50% peak intensity without additional secondary optical components.

2. The A-19 lamp of claim 1, wherein the outer envelope structure is characterized by a diameter of approximately 2 3/8 inches.

3. The A-19 lamp of claim 1, wherein the plurality of light-emitting diodes (LEDs) are disposed over a single recess surrounded by sidewalls in a substrate, wherein the single lens has a planar bottom surface disposed over the sidewalls.

4. The A-19 lamp of claim 1, wherein the single lens has a convex top surface, and a height of the lens is substantially less than its lateral dimension.

5. The A-19 lamp of claim 1, wherein substrate having a plurality of base layers of an electrically insulating material, a plurality of electrical contacts disposed on a top one of the base layer, and a plurality of electrical paths coupled to the electrical contacts, wherein at least a portion of the plurality of electrical paths is disposed between the base layers.

6. The A-19 lamp of claim 1, wherein a diameter of the single lens in the emitter is wider than the recess.

7. The A-19 lamp of claim 1, wherein a diameter of the single lens in the emitter is substantially equal to a diagonal dimension of the substrate.

8. The A-19 lamp of claim 1, wherein the lens is made of a single optically-transparent material.

9. An LED (light-emitting diode) lamp, comprising:
   an outer envelope structure configured for transmission of light therethrough;
   a base coupled the outer envelope structure for connecting to an external power source;
   a driver circuit coupled to the base for receiving power from the external power source;
   an LED emitter disposed inside the outer envelope for receiving regulated power from the driver circuit and for emitting light that is transmitted through the outer envelope structure, wherein the LED emitter comprises:
   a plurality of light-emitting diodes (LEDs) disposed over a single recess in a substrate; and
   a single lens disposed over the LEDs and the substrate, wherein the single lens has a planar bottom surface disposed over sidewalls of the recess;
   wherein the LED lamp is configured to provide light for transmission through the outer envelope structure without additional secondary optical components,
   wherein the emitter is configured to consume electrical power of 20 Watts or higher and to provide light distribution at 130 degrees or wider at 50% peak intensity without additional secondary optical components.

10. The LED lamp of claim 9, wherein substrate having a plurality of base layers of an electrically insulating material, a plurality of electrical contacts disposed on a top one of the base layer, and a plurality of electrical paths coupled to the electrical contacts, wherein at least a portion of the plurality of electrical paths is disposed between the base layers.

11. The lamp of claim 9, wherein the single lens has a convex top surface, and a height of the lens is substantially less than its lateral dimension.

12. The lamp of claim 9, wherein the lens is made of an optically-transparent material and without additional color-shifting phosphor.

13. The lamp of claim 9, wherein each LED being coated with a material containing a color-shifting phosphor.

14. A multiple-LED (light-emitting diode) emitter for providing high-power wide-angle beam with a single lens, the emitter comprising:
- a substrate having a plurality of base layers of an electrically insulating material, a plurality of electrical contacts disposed on a top one of the base layer, and a plurality of electrical paths coupled to the electrical contacts, wherein at least a portion of the plurality of electrical paths is disposed between the base layers;
- a plurality of light-emitting diodes (LEDs) disposed over the substrate, each of the LEDs being coupled to an electrical contact, each LED being coated with a material containing a color-shifting phosphor; and
- a single lens overlying the plurality of LEDs, wherein the plurality of LEDs are disposed in a recessed region in the substrate, and the lens is characterized by a circular shape with a diameter that is greater than a width dimension of the substrate, wherein the single lens has a planar bottom surface disposed over sidewalls of the recessed region,
- wherein the lens is configured to for the emitter to provide a view angle of 130 degrees or wider at 50% brightness, and wherein the emitter is configured for receiving a driving power of up to 40 Watts.

15. The emitter of claim 14, wherein the emitter is configured to be disposed within an A-19 bulb outer shell without secondary optics to produce light distribution for an A-19 light bulb.

16. The emitter of claim 14, wherein substrate having a plurality of base layers of an electrically insulating material, a plurality of electrical contacts disposed on a top one of the base layer, and a plurality of electrical paths coupled to the electrical contacts, wherein at least a portion of the plurality of electrical paths is disposed between the base layers.

17. The emitter of claim 14, wherein the single lens has a convex top surface, and a height of the lens is substantially less than its lateral dimension.

18. The emitter of claim 14, wherein the lens is made of an optically-transparent material and without additional color-shifting phosphor.

19. The emitter of claim 14, wherein the diameter of the lens is substantially equal to a diagonal dimension of the substrate.

* * * * *